United States Patent [19]

Knauer et al.

[11] 4,314,163
[45] Feb. 2, 1982

[54] INPUT STAGE FOR A CHARGE TRANSFER DEVICE (CTD) ARRANGEMENT

[75] Inventors: Karl Knauer, Kirchseeon; Hans-Joerg Pfleiderer, Zorneding, both of Fed. Rep. of Germany

[73] Assignee: Siemens Aktiengesellschaft, Berlin & Munich, Fed. Rep. of Germany

[21] Appl. No.: 219,215

[22] Filed: Dec. 22, 1980

Related U.S. Application Data

[63] Continuation of Ser. No. 63,930, Aug. 6, 1979.

[30] Foreign Application Priority Data

Aug. 31, 1978 [DE] Fed. Rep. of Germany ....... 2838100

[51] Int. Cl.³ .................. G11C 19/28; H01L 29/78; H03H 15/02
[52] U.S. Cl. ................. 307/221 D; 357/24; 333/165
[58] Field of Search .................. 357/24; 307/221 D; 333/165

[56] References Cited

U.S. PATENT DOCUMENTS

| | | | |
|---|---|---|---|
| 4,056,737 | 11/1977 | Sequin | 357/24 |
| 4,071,775 | 1/1978 | Hewes | 357/24 |
| 4,163,957 | 8/1979 | Knauer et al. | 357/24 |
| 4,188,597 | 2/1980 | Knauer | 357/24 |
| 4,233,578 | 11/1980 | Knauer et al. | 357/24 |

OTHER PUBLICATIONS

Sealer et al., "A Dual Differential Charge-Coupled Analog Delay Device", IEEE J. Solid-State Circuits, vol. SC-11 (2/76), pp. 105-108.

*Primary Examiner*—Gene M. Munson
*Attorney, Agent, or Firm*—Hill, Van Santen, Steadman, Chiara & Simpson

[57] ABSTRACT

The invention relates to an input stage for a charge transfer device (CTD) arrangement which contains a source zone in a semiconductor body, two input electrodes, and a transfer gate, wherein one input gate is connected to a fixed voltage, and the other input gate is supplied with an analog input signal. In input stages of this kind, it is endeavored to evaluate the input signal within the widest possible limits without the need of altering the assigned semiconductor surface. The invention achieves this aim in that the input stage is divided into two input channels which possess different widths and which open into the CTD channel. A positive evaluation of the input signal is carried out via the first input channel, whereas a negative evaluation is carried out via the second input channel. The difference in area between the second input gate electrodes of the two input channels represents a gauge of the evaluation coefficient and can be kept very small. The range of application of the invention covers arbitrary CTD circuits, and in particular CTD transversal filters.

3 Claims, 3 Drawing Figures

INPUT STAGE FOR A CHARGE TRANSFER DEVICE (CTD) ARRANGEMENT

This is a continuation of application Ser. No. 063,930, filed Aug. 6, 1979.

BACKGROUND OF THE INVENTION

The invention relates to an input stage for a charge transfer device arrangement, and particularly to an input stage which forms the parallel input of a transversal filter. In German OS 26 43 704, corresponding to U.S. application Ser. No. 832,232, now issued as U.S. Pat. No. 4,163,957, there is described a close relationship between the overall surface occupied by the input stage on a semiconductor layer and the value of the evaluation coefficient which represents a gauge of the quantity of charge input into the CTD arrangement in dependence upon the prevailing input signal value.

BRIEF SUMMARY OF THE INVENTION

The present invention relates to an input stage for a charge transfer device (CTD) arrangement which contains a source zone, two input electrodes, and a transfer gate. One input gate is connected to a fixed voltage, while the other input gate is supplied with an analog input signal (u). In input stages of this kind, an effort is made to evaluate the input signal (u) within the widest possible limits without the need to alter the allotted semiconductor surface. The invention achieves this aim by dividing the input stage into two input channels which possess different widths and which open into the CTD channel. A positive evaluation of the input signal is carried out via the first input channel, whereas a negative evaluation is carried out via the second input channel. The difference in area between the second input gate electrodes of the two input channels represents a gauge of the evaluation coefficient and can be kept very small. The range of application of the invention covers arbitrary CTD circuits, and in particular, CTD transversal filters.

The aim of the present invention is to provide an input stage in which the coefficient which evaluates the input signal is substantially less dependent upon the available semiconductor surface than in heretofor known input stages.

The advantage which can be achieved by means of the invention consists in particular in the very low evaluation coefficients which can be obtained which cannot be obtained in conventional input stages due to the undershooting of necessary minimum dimensions of the first and second input electrodes. Moreover, production related fluctuations in the length or width of the input electrodes (inasmuch as these commonly occur in the second input electrodes of the two input channels) do not affect the value of the evaluation coefficient. When the input stage corresponding to the invention is used as a parallel input of a transversal filter, it is extremely advantageous that very low evaluation coefficients be achieved so that in the case of a given surface outlay for the individual input stages of the filter, or in the case of a given maximum ratio between the surface for the input stage having the highest evaluation coefficient and the surface for the input stage having the lowest evaluation coefficient, the ratio between the highest and lowest evaluation coefficients attains a substantially higher value than in known filter circuits.

BRIEF DESCRIPTION OF THE DRAWINGS

The invention will be explained in detail, making reference to the drawings, in which.

DESCRIPTION OF THE PREFERRED EMBODIMENTS

Figure 1:
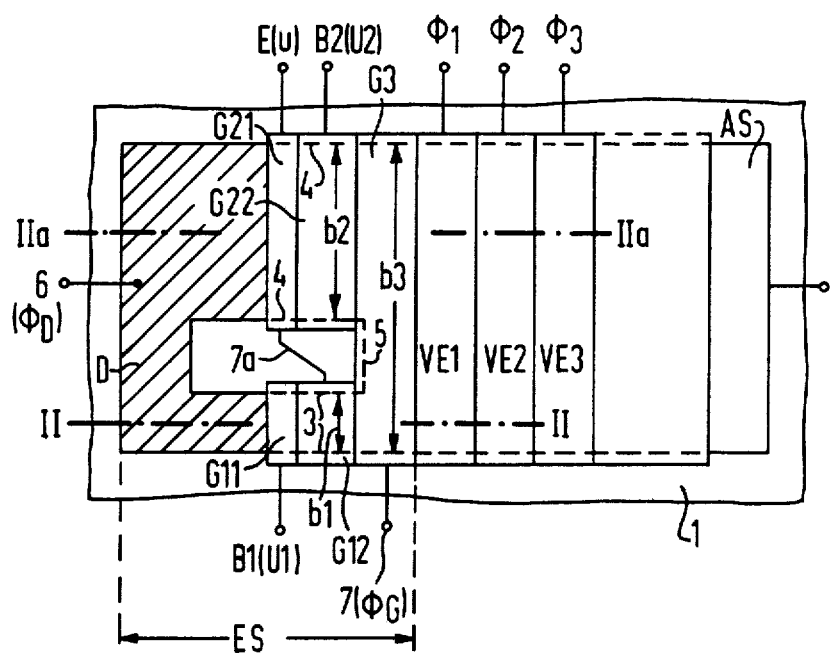
FIG. 1 is a plan view of an input stage, designed in accordance with the present invention, in a CTD arrangement.

FIG. 1 schematically illustrates a CTD arrangement which is designed as a CCD and which is constructed on a doped semiconductor layer 1 of a given conductivity type and consisting for example, of n-doped silicon. Its input stage, ES, possesses a zone D which has been represented by shading and which has the opposite type conductivity and is produced, for example, by a diffusion process. The surface of the semiconductor layer 1 is covered with an electrically insulating layer 2 (FIG. 2), which is extremely thin in parts, and consists, for example, of $SiO_2$. Above this insulating layer are arranged input gate electrodes G11, G12, G21 and G22, and a transfer gate G3. The input gate electrodes G11 and G12, which are located beside one another above a first input channel 3. This channel 4 is that region which is defined in that outside of the broken lines provided with this reference the electrically insulating layer 2 is considerably thicker than between these lines. In the case of a $SiO_2$ layer, the thicker zones are referred to as field oxide zones, whereas the thinner zones are referred to as gate oxide zones, and the input channel 3 is defined by a thin film zone of this kind. The input gate electrodes G21 and G22 are arranged similarly above a second input channel 4. Here the width of the two input channels is referenced b1 and b2 respectively.

As indicated in FIG. 1 by the broken line 5, beneath the transfer gate G3 which couples the input stage ES to the other parts of the CTD arrangement, the two input channels 4 and 5 open into a common channel having a width b3 which continues beneath those parts of the transfer electrodes referenced VE1, VE2 and VE3 which are separated from the semiconductor layer 1 by a thin film zone of the electrically insulating layer 2. Thick film zones of the insulating layer 2 are arranged outside the common channel which is defined by the width b3 and which is also referred to as the channel of the CTD arrangement. If the CTD arrangement operates in three-phase fashion, the transfer electrodes VE1 to VE3 belong to one stage. Further stages of similar structure adjoin on the right hand side of FIG. 1, where the individual transfer electrodes are arranged in a row beside one another and above a thin film zone. An output stage AS provided with a terminal A is located at the end of this row.

The zone D is provided with a terminal 6 which is supplied with a first pulse train voltage $\phi_D$. Via its terminal B1, the input gate G11 is supplied with a constant d.c. voltage U1, whereas the input gate G21 and the input gate G12 connected thereto via a conductor path 7a are supplied via a terminal E with an analog input signal u. The input gate G22 is fed via a terminal B2 with a constant d.c. voltage U2, whereas the transfer gate G3 is provided with a terminal 7 to which a second pulse train voltage $\phi_G$ is connected. The transfer electrodes VE1 to VE3 are fed via the illustrated terminals with transfer pulse train voltages $\phi_1$ to $\phi_3$ while an output signal $u_a$ can be tapped from the terminal A.

Figure 2:
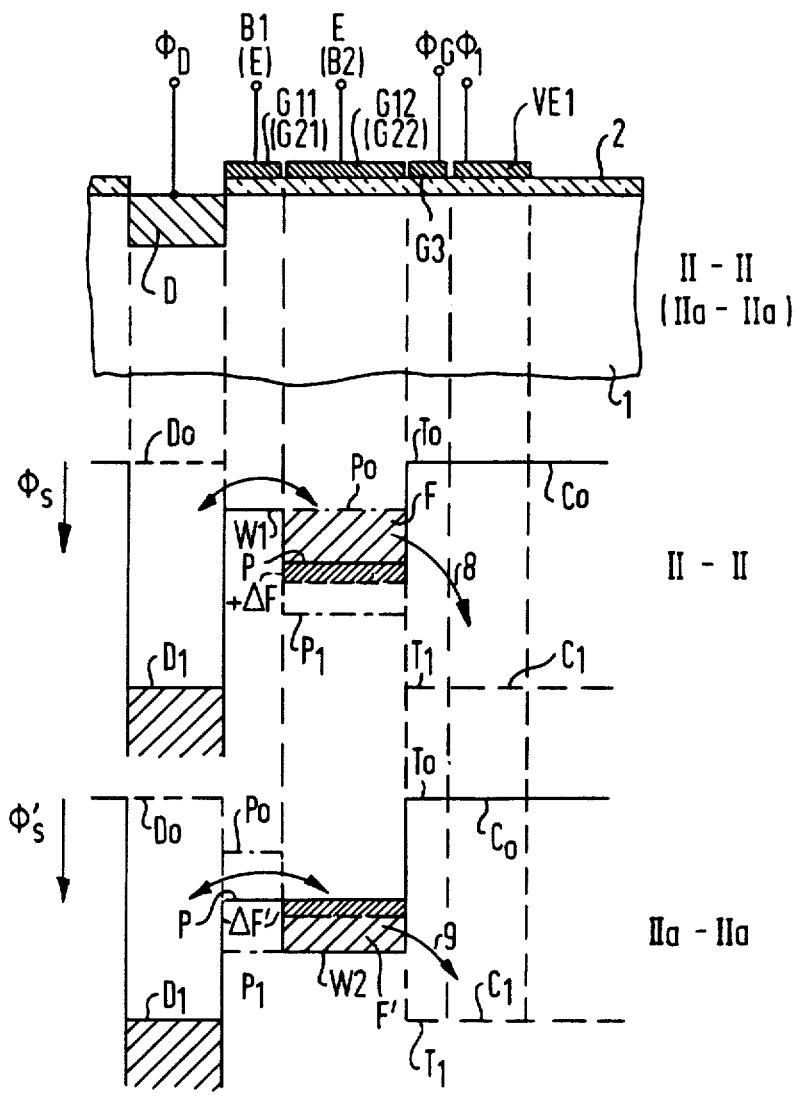
FIG. 2 is a cross-section through the input stage illustrated in FIG. 1 as taken along either line II—II or along line IIa—IIa.

FIG. 2 shows a cut-away illustration of the input stage ES from FIG. 1 along the lines II—II and IIa—IIa. Here those parts already illustrated in FIG. 1 have been provided with the same references. The thin insulating layer upon which the components G11, G21, G12, G22, G3 and VE1 are positioned is referenced 2. If the section II—II is first considered, the terminal B1 of the first input gate G11 is supplied with a constant d.c. voltage U1 which at the maximum is equal to the smallest input signal u which is to be evaluated, so that a fixed potential threshold W1 is set up for the surface potential $\phi_s$, considered along II—II, beneath G11. The terminal E is supplied with the input signal u, and potential values P of between P1 (for the maximum signal $U_1$) and P0 (for the minimum signal $u_0$) occur beneath G12.

Figure 3:
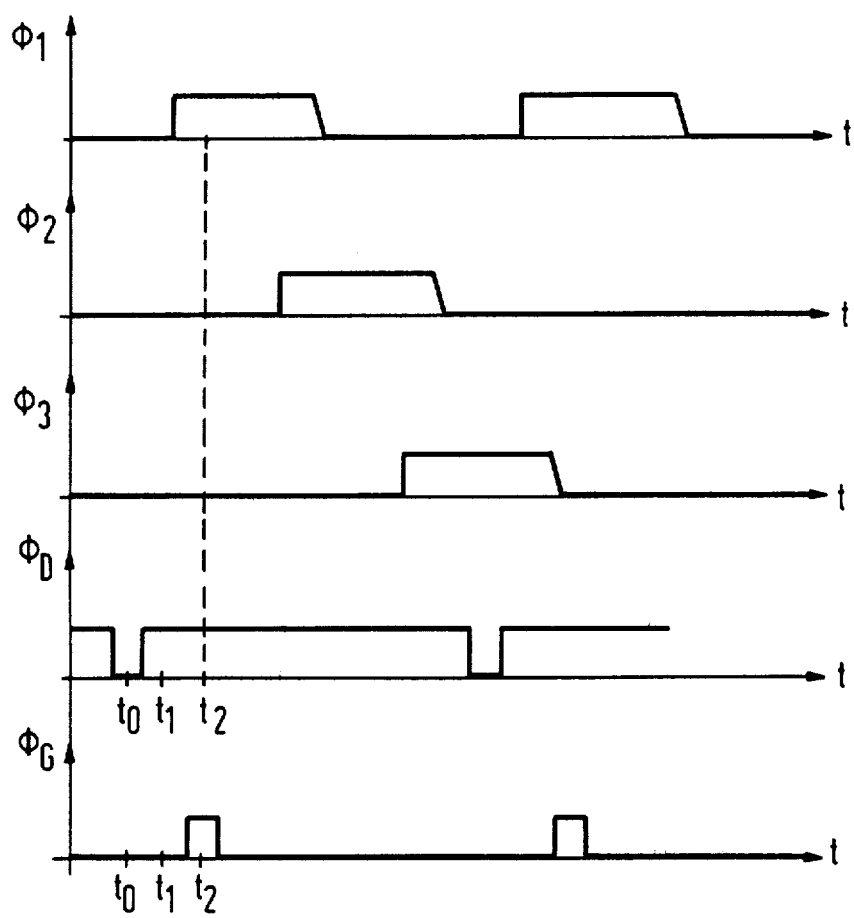
FIG. 3 is a time diagram in explanation of the mode of operation of the input stage illustrated in FIG. 1.

Under the influence of the pulse train voltages $\phi_G$ and $\phi_D$ which are represented in FIG. 3 and are fed to the terminals 6 and 7, potential values $D_1$ and $D_0$ and $T_1$, $T_0$ occur within the doped zone D and beneath the transfer gate G3. At the time $t_0$ (FIG. 3), a potential curve $D_0$, $W_1$, P, $T_0$ and $C_0$ prevail, the potential value P being determined by the value of the input signal u which occurs at the time $t_0$. The potential well formed beneath G12 is now flooded with charge carriers. At the time $t_1$, $D_0$ has changed to $D_1$ and the charge carriers return into the zone D from the zone beneath G11 and G12 to such an extent that the potential well beneath G12 is only filled up to the boundary designated $W_1$, which is indicated in FIG. 2 by the shaded area F. If $T_0$ has then become $T_1$ (time $t_2$), the quantity of charge indicated by F is transferred in accordance with the arrow 8 beneath the transfer electrode VE1 as the latter is simultaneously connected to a relatively high transfer pulse train voltage $\phi_1$, which produces a potential value of $C_1$. Here an essential feature consists in that with the described design and mode of operation of the input channel 3, on the occurrence of the minimum input signal $u_0$, on account of P=P0, no charge is input, whereas on the occurrence of the maximum input signal $u_1$, on account of P=P1, the maximum quantity of charge which can be represented by the surface located between the values P0 and P1 is input. The input process is repeated with the frequency of the transfer pulse train voltage $\phi_1$.

If we now consider the second input channel 4 and the potential curve $\phi_s'$ which occurs along the line IIa—IIa, the first input stage G21 is supplied via the terminal E with the input signal u, whereas the second input stage G22 is now supplied via the terminal B2 with a constant d.c. voltage U2 which is at least equal to the maximum input signal $u_1$ which is to be evaluated, and produces a fixed potential value $W_2$ beneath G22. Beneath G21 the potential values $P_1$ occur for the maximum input signal $u_1$, and P0 for the minimum input signal $u_0$. Here the potential well beneath G22 can only be filled up to the boundary P governed by the input signal u prevailing at the time t1, which is indicated in FIG. 2 by the area F'. Following the transition from $T_0$ to $T_1$ and from $C_0$ to $C_1$ (time t2), the quantity of charge F' is transferred back beneath the electrode VE1 (arrow 9). Here it is an essential feature that in the input channel 4, on the occurrence of the minimum input signal $u_0$, on account of P=P0, the maximum quantity of charge is input which is illustrated in FIG. 2 by an area below G2 and between the potential values P0 and P1, whereas in the case of the maximum input signal $u_1$, on account of P=P1, no charge is input. This input process is again repeated with the frequency of the transfer pulse train voltage $\phi_1$.

The fundamental illustration in FIG. 2 has hitherto been based upon the assumption that the channel widths b1 and b2 are equal. Only under this assumption do the areas F and F' directly correspond to the quantities of charge input via the input channels 3 and 4. If the input channels 3 and 4 are designed, in accordance with the invention, to have different widths b1 and b2 and if the ratio between the active areas of G12 and G22, i.e., the areas above the channels, is, for example, 1:3, which corresponds to the embodiment of the invention illustrated in FIG. 1, the area F must be multiplied by the factor 1, whereas the area F' must be multiplied by the factor 3 in order to obtain a gauge of the input quantities of charge. On the occurrence of an input signal u which, in accordance with FIG. 2, corresponds to the arithmetic mean value of $u_0$ and $u_1$, a charge corresponding to the area F is input via the channel 3 whereas a charge corresponding to the area 3.F' is input via the channel 4. The sum thereof forms an overall charge L which is proportional to the area F+3F'. In FIG. 2, each signal change $+\Delta u$ leads to changes in area $+\Delta F$ and $-\Delta F'$ which, taking into account the different channel widths b1 and b2 represented in FIG. 1, leads to a change in the input quantity of charge by an amount corresponding to an area of $-2\Delta F$. This results in an evaluation coefficient of the input stage of $-2$ which corresponds to the difference between the area to be positively evaluated of the input gate G12 and the area to be negatively evaluated of the input gate G22, measured in the same area units. If, on the other hand, the areas of G12 and G22 are identical, with an evaluation coefficient of zero only a basic charge of constant value would be input. In order to attain an evaluation coefficient of $+1$, it would thus be necessary for the areas of G11 and G22, measured in the same area units, to differ from one another by an area unit of this kind, where G12 would have to possess the larger area.

Although the previously described and illustrated exemplary embodiment of the invention has been based upon a CCD in which the charges are transferred on the surface of the semiconductor layer 1, the input stage in accordance with the invention can of course, also be provided for CCDs in which charge transport takes place inside the semiconductor layer 1 and which can be commonly designated BCCDs. Moreover, the input stage can also be used in conjunction with other arrangements which are known per se and which are commonly designated CTDs, such as described, for example, in the book by Sequin and Tompsett "Charge Transfer Devices", Academic Press, New York, 1975, on pages 1 to 18. In dependence upon its construction, the CTD in accordance with the invention can operate in two-phase, three-phase, four-phase, or multi-phase fashion.

In a simplified design of the input stage corresponding to the invention, the transfer gate G3 can be dispensed with in which case the first transfer electrode VE1 would be positioned closely beside the input electrodes G12 and G22.

If the input stage corresponding to the invention is used as parallel input of transversal filter, such as disclosed, for example, in the German OS 26 43 704, if the areas of G12 and G22 approach a common value as closely as allowed by production, it is possible to achieve a very low evaluation coefficient governed by the area difference, whereas in the case of another parallel input, of identical construction, within the same filter, these areas can differ from one another in size to such an extent that a very high evaluation coefficient is achieved for the parallel input. In this way, it is possible to select the evaluation coefficients of the parallel inputs of the filter from a range of values which considerably exceeds that which was previously available, which permits a decisive refinement of the attainable filter characteristics.

It will be apparent to those skilled in the art that many modifications and variations may be effected without departing from the spirit and scope of the novel concepts of the present invention.

We claim as our invention:

1. A charge transfer device comprising, semiconductor layer (1) of a first conductivity type, an input zone (D) of opposite conductivity type formed in said semiconductor layer, a thin insulating layer (2) covering a portion of said semiconductor layer (1), a first pair of gates (G11, G12) successively aligned on said insulating layer (2) in the channel flow direction of a first channel which is defined by longitudinally extending parallel first limited charge flow means to prevent charge transfer on opposite sides of said first channel and the transverse distance between said first limited charge flow means comprising the width of said first channel, a second pair of gates (G21, G22) successively aligned on said insulating layer (2) in the channel flow direction of a second channel which is defined by longitudinally extending parallel second limited charge flow means to prevent charge transfer on opposite sides of said second channel and the transverse distance between said second limited charge flow means comprising the width of said second channel and said width of said second channel being substantially greater than said width of said first channel, a first transfer gate (G3) mounted on said insulating layer (2) adjacent said first and second pair of gates and extending over a common channel formed by the juncture of said first and second channels and extending transversely to said common channel, an input analog signal (u) connected to the second (G12) of said first pair of gates and to the first (G21) of said second pair of gates, a first DC voltage source connected to the first (G11) of said first pair of gates, a second DC voltage source connected to the second (G22) of said second pair of gates, second and third transfer gates extending over said common channel adjacent said first transfer gate (G3) and extending transversely to said common channel and means for applying electrical signals to said input zone (D), and said first (G3), second and third transfer gates so that charges move through said first and second channels at the same time and are combined in said common channel, said first DC source having a voltage level not greater than the smallest valve of said input analog signal (u), and said second DC source having a voltage level at least as large as the maximum value of said input analog signal (u).

2. A charge transfer device according to claim 1 wherein the area of said first channel beneath said second (G12) of said first pair of gates being less than the area of said second channel beneath the first (G21) of said second pair of gates so that the charges transferred through said first and second channels have the same ratio as said areas.

3. A charge transfer device according to claim 2 wherein said second one (G12) of said first pair of gates and said first one (G21) of said second pair of gates are electrically connected together.

* * * * *